US009258916B2

(12) United States Patent
Lu et al.

(10) Patent No.: US 9,258,916 B2
(45) Date of Patent: Feb. 9, 2016

(54) HIGH DENSITY CASSETTE STORAGE SYSTEM

(71) Applicant: Go!Foton Holdings, Inc., Somerset, NJ (US)

(72) Inventors: Haiguang Lu, Los Altos, CA (US); Kenichiro Takeuchi, North Brunswick, NJ (US); Alla Shtabnaya, Hillsborough, NJ (US)

(73) Assignee: Go!Foton Holdings, Inc., Somerset, NJ (US)

( * ) Notice: Subject to any disclaimer, the term of this patent is extended or adjusted under 35 U.S.C. 154(b) by 152 days.

(21) Appl. No.: 14/201,057

(22) Filed: Mar. 7, 2014

(65) Prior Publication Data

US 2015/0257295 A1  Sep. 10, 2015

(51) Int. Cl.
*H05K 5/02* (2006.01)

(52) U.S. Cl.
CPC .................................. *H05K 5/0256* (2013.01)

(58) Field of Classification Search
CPC ..... G06F 13/409; G06F 1/181; G06F 1/1632; G06F 1/1656; G06F 1/188; G02B 6/4246; H05K 7/02; H05K 1/142; H05K 5/0021; H05K 7/1409; H05K 7/1411
See application file for complete search history.

(56) References Cited

U.S. PATENT DOCUMENTS

| | | | | |
|---|---|---|---|---|
| 6,227,632 B1 * | 5/2001 | Liu | G06F 1/181 312/223.2 |
| 6,233,152 B1 * | 5/2001 | Abbott | G06F 1/184 312/223.1 |
| 6,386,120 B1 * | 5/2002 | Nelson | H05K 7/1489 108/134 |
| 6,392,875 B1 * | 5/2002 | Erickson | G06F 1/184 360/98.08 |
| 6,404,642 B1 * | 6/2002 | Greenfield | G11B 33/022 361/679.33 |
| 6,879,484 B2 * | 4/2005 | Chou | G06F 1/184 361/679.02 |
| 7,257,827 B2 * | 8/2007 | Lee | G11B 33/022 312/223.2 |
| 7,433,183 B2 * | 10/2008 | Huang | G06F 1/187 312/223.2 |
| 7,486,504 B2 * | 2/2009 | Chen | G06F 1/18 361/679.31 |
| 7,494,195 B2 * | 2/2009 | Han | H02G 3/081 312/223.2 |
| 7,532,465 B2 * | 5/2009 | Chen | G06F 1/187 361/679.33 |
| 7,542,269 B2 * | 6/2009 | Chen | G06F 1/188 361/679.02 |
| 7,643,280 B2 * | 1/2010 | Chen | G11B 33/123 361/679.33 |
| 7,644,420 B2 * | 1/2010 | Korikawa | G11B 33/126 720/657 |
| 8,254,108 B2 * | 8/2012 | Chang | H05K 7/1489 312/223.2 |
| 8,400,768 B2 * | 3/2013 | Baitz | G06F 1/181 361/679.02 |

(Continued)

*Primary Examiner* — Hoa C Nguyen
*Assistant Examiner* — Xanthia C Cunningham
(74) *Attorney, Agent, or Firm* — Lerner, David, Littenberg, Krumholz & Mentlik, LLP

(57) ABSTRACT

A cassette conveying system comprising a housing having front, back, left, and right sides, wherein the front side is open; and a cassette holding assembly for holding one or more cassettes, the holding assembly including a bracket to which each cassette is coupled, each cassette including at least one device and receiving one or more cables operatively connected to the device, and a cassette conveying assembly operably coupling the cassette holding assembly to the housing such that the cassette holding assembly is linearly and rotationally movable in relation to the housing and transitionable between a stored state and a retracted state; wherein, in the stored state, the cassette holding mechanism is stored completely within the housing; and wherein, in the retracted state, the cassette holding mechanism is at least partially external the front side of the housing.

14 Claims, 12 Drawing Sheets

(56) References Cited

U.S. PATENT DOCUMENTS

| | | | | |
|---|---|---|---|---|
| 8,550,576 B2* | 10/2013 | Chen | G06F 1/187 | 312/223.2 |
| 8,564,946 B2* | 10/2013 | Kadri | G06F 1/187 | 29/592.1 |
| 2002/0172003 A1* | 11/2002 | Bang | G06F 1/181 | 361/679.58 |
| 2003/0202321 A1* | 10/2003 | Lin | G06F 1/187 | 361/679.33 |
| 2004/0190235 A1* | 9/2004 | Chou | G06F 1/184 | 361/679.02 |
| 2005/0168932 A1* | 8/2005 | Selvidge | G06F 1/184 | 361/679.33 |
| 2007/0019379 A1* | 1/2007 | Hsiao | G06F 1/187 | 361/679.02 |
| 2007/0058333 A1* | 3/2007 | Kim | G06F 1/187 | 361/679.59 |
| 2007/0153469 A1* | 7/2007 | Chen | G06F 1/187 | 361/679.31 |
| 2008/0123280 A1* | 5/2008 | Chen | G06F 1/187 | 361/679.33 |
| 2008/0137280 A1* | 6/2008 | Chen | G06F 1/188 | 361/679.39 |
| 2008/0158809 A1* | 7/2008 | Chen | G06F 1/187 | 361/679.37 |
| 2008/0298007 A1* | 12/2008 | Chen | G11B 33/125 | 361/679.33 |
| 2010/0175252 A1* | 7/2010 | Garcia | H01R 12/523 | 29/854 |
| 2013/0205579 A1* | 8/2013 | Mather | G06F 1/16 | 29/593 |
| 2013/0342990 A1* | 12/2013 | Jau | G06F 1/187 | 361/679.39 |
| 2014/0204497 A1* | 7/2014 | Martinez Sanchez | H05K 7/186 | 361/119 |
| 2014/0362515 A1* | 12/2014 | Pronozuk | H05K 7/1487 | 361/679.31 |

* cited by examiner

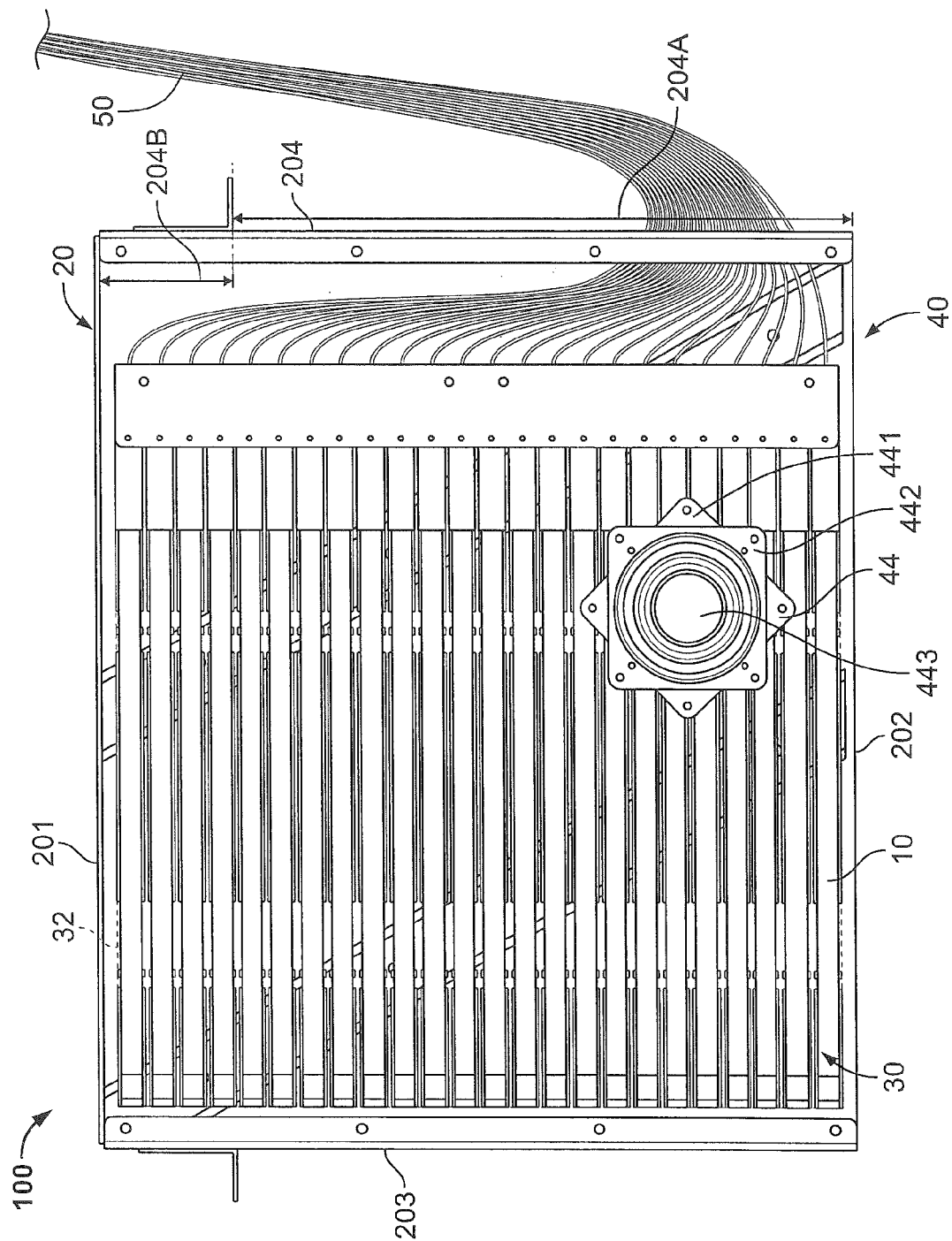

HIGH DENSITY CASSETTE STORAGE SYSTEM

FIELD

The present disclosure generally relates to an apparatus and a system for supporting and managing communication devices. More particularly, the present disclosure relates to a cassette conveying assembly for coupling to a cassette holding assembly that holds a plurality of cassettes which store communication devices coupled to communication cables extending external to the cassettes, and a system for storing the cassette holding assembly, that facilitates access to the cassettes, the devices and the cables in a communication networking application.

BACKGROUND

In communication networking applications, a cassette, which is a compact, unitary apparatus for routing one or more cables to one or more optical or electronic devices enclosed within the cassette, may be provided. For example, the cassette may be in the form of a splice tray containing splice connections of a plurality of optical fibers to optical devices. The cassette serves to facilitate coupling of the device with one or more cables extending from the cassette to an external component, as well as protect the device from potential damage such as mechanical shock or contaminants.

As a plurality of devices is often required in a single networking application, a plurality of cassettes may be provided to enclose the devices, and a cassette holding assembly may be provided to store the cassettes in an organized manner. The cassette holding assembly may orient the cassettes in an aligned stack, where cables are coupled to or extend from one side or opposing sides of the cassettes.

In some cassette installation configurations, the cassette holding assembly may have cables extending from only a single side and be stored within a housing, such that, in a stored state of the holding assembly, the cables extend from a single side of the housing that is other than the front or back side of the housing. In one such cassette installation configuration, the cassettes may be accessed by pulling the cassette holding assembly away from a back side of a housing towards a front side of the housing, in a direction generally parallel to the left and right sides of the housing. In this configuration, additional lengths of the cables connected to or extending from the individual cassettes are provided, based on the expected distance the cassettes will be positioned away from the back side of the housing when the cassette holding assembly is in a retracted state. Such additional lengths of cables are provided to avoid the cables connected to or extending from the individual cassettes from being subject to tension or stress when the cassette holding assembly is moved between a retracted state and a stored state. The additional lengths, however, may become tangled, thereby making it difficult to access individual cassettes and the cables extending therefrom when the cassette holding assembly is in the retracted state.

In another cassette installation configuration, the cassettes of the cassette holding assembly may be accessed by rotation of the holding assembly to the left or right side of the housing. In such a configuration, the housing typically has an increased dimension extending longitudinally between the left and right sides that provides additional space between the holding assembly and the left or right side when the holding assembly is in the stored state. This additional space permits rotation of the holding assembly from a stored state to a retracted state and vice versa. The additional space of the housing, however, typically is not used when the cassette holding assembly is in a stored state. The provision of such additional space in the housing is undesirable, because the space available for the housing in a networking installation is usually very limited.

As such, there exists a need for an improved apparatus and system for accessing cassettes of cassette holding assemblies stored in a housing in a networking installation.

BRIEF SUMMARY

In one embodiment of the present disclosure, a conveying assembly for conveying a cassette holding assembly may include a first track extending linearly from a first end to a second end; a first rail slidably coupled to the first track and transitionable between the first end and the second end; a pallet coupled to the first rail such that the pallet is linearly movable in a direction of the first track in correspondence with the first rail transitioning between the first end and the second end of the first track; and a rotational assembly coupled to the pallet and configured for coupling to a cassette holding assembly such that, by operation of the rotational assembly, the cassette holding assembly is rotatable relative to the pallet, wherein, when the rotational assembly is coupled to the cassette holding assembly in an installed state, the cassette holding assembly is linearly movable in correspondence with the linear movement sliding of the pallet based on the first rail sliding along the first track to transition between the first end and the second end, and the cassette holding assembly is rotatable relative to the pallet.

In another embodiment, the conveying assembly may include an arm member including a first member pivotably coupled to one of the right or left sides of the housing at a first end and defining a hollow cylinder at a second end; and a second member slidably inserted into the hollow cylinder of the first member at a first end and pivotably coupled to the cassette holding assembly at a second end, wherein the cassette holding assembly is simultaneously movable: linearly by sliding of the second member in or out of the first member, and rotationally by pivotal movement of at least one of the first member about the right or left side of the housing or the second member about the cassette holding assembly.

In another embodiment, a cassette conveying system may include a housing having front, back, left, and right sides, wherein the front side is open; and a cassette holding assembly for holding one or more cassettes, the holding assembly including a bracket to which each cassette is coupled, each cassette including at least one device and receiving one or more cables operatively connected to the device, and a cassette conveying assembly operably coupling the cassette holding assembly to the housing such that the cassette holding assembly is linearly and rotationally movable in relation to the housing and transitionable between a stored state and a retracted state; wherein, in the stored state, the cassette holding mechanism is stored completely within the housing; and wherein, in the retracted state, the cassette holding mechanism is at least partially external the front side of the housing.

These and other features of the present disclosure will be more fully described with reference to the accompanying figures.

BRIEF DESCRIPTION OF THE DRAWINGS

By way of description only, embodiments of the present disclosure will be described herein with reference to the accompanying drawings, in which:

FIG. 4A is a top view of a cassette conveying assembly adapted to a cassette holding assembly in a housing, with the cassette holding assembly in a stored state;

DETAILED DESCRIPTION

Figure 1:
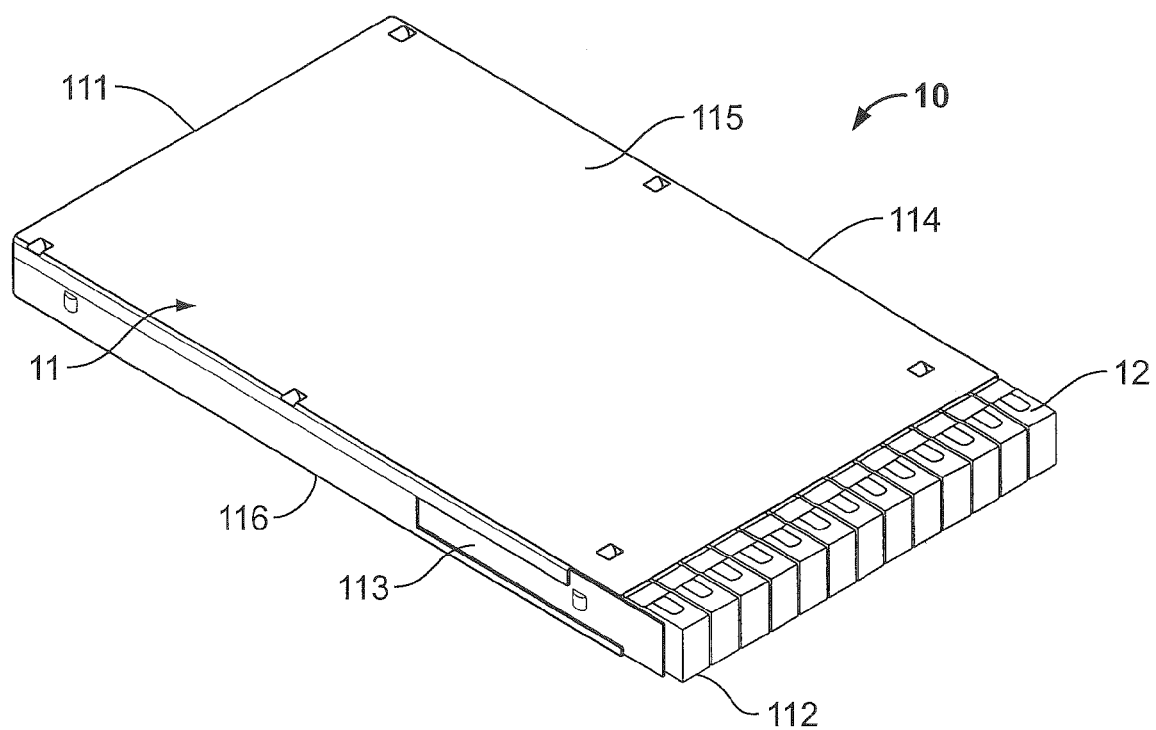
FIG. 1 is a perspective view of an exemplary cassette including an enclosure and a plurality of ports.

Particular embodiments of the present disclosure will be described with reference to the accompanying drawings. In the figures and in the description that follow, in which like reference numerals identify similar or identical elements, the term "front" will refer to the side of the device or apparatus that typically is closest to the operator or user during use, while the term "back" will refer to the side of the device or apparatus that typically is furthest from the operator or user during use.

An exemplary cassette 10 will now be described with reference to FIG. 1. The cassette 10 may include an enclosure 11 defined by a back and a front side 111, 112, a left and a right side 113, 114, and a top and a bottom portion 115, 116, a device (not shown) stored within the enclosure 11, and one or more ports 12 at the front side 112. The enclosure 11, which may be in the form of a splice tray, may be configured for receiving and attaching thereto one or more electrical, optical or electro-optical devices, such that the devices may be stored within the enclosure 11. The ports 12 may be configured such that suitable connection means, for example, optical fiber cables (not shown), may extend therethrough to connect to other optical fiber cables or devices stored within the enclosure 11. Although cassettes 10 are shown coupled to the cassette conveying system of the present disclosure, it is understood that any other embodiment of a cassette may be compatible with the system.

An exemplary cassette conveying system 100 will now be described with reference to FIGS. 2A-2E. System 100 may include a housing 20, a cassette holding assembly 30 for holding a plurality of cassettes 10, and a cassette conveying assembly 40.

Figure 2A:
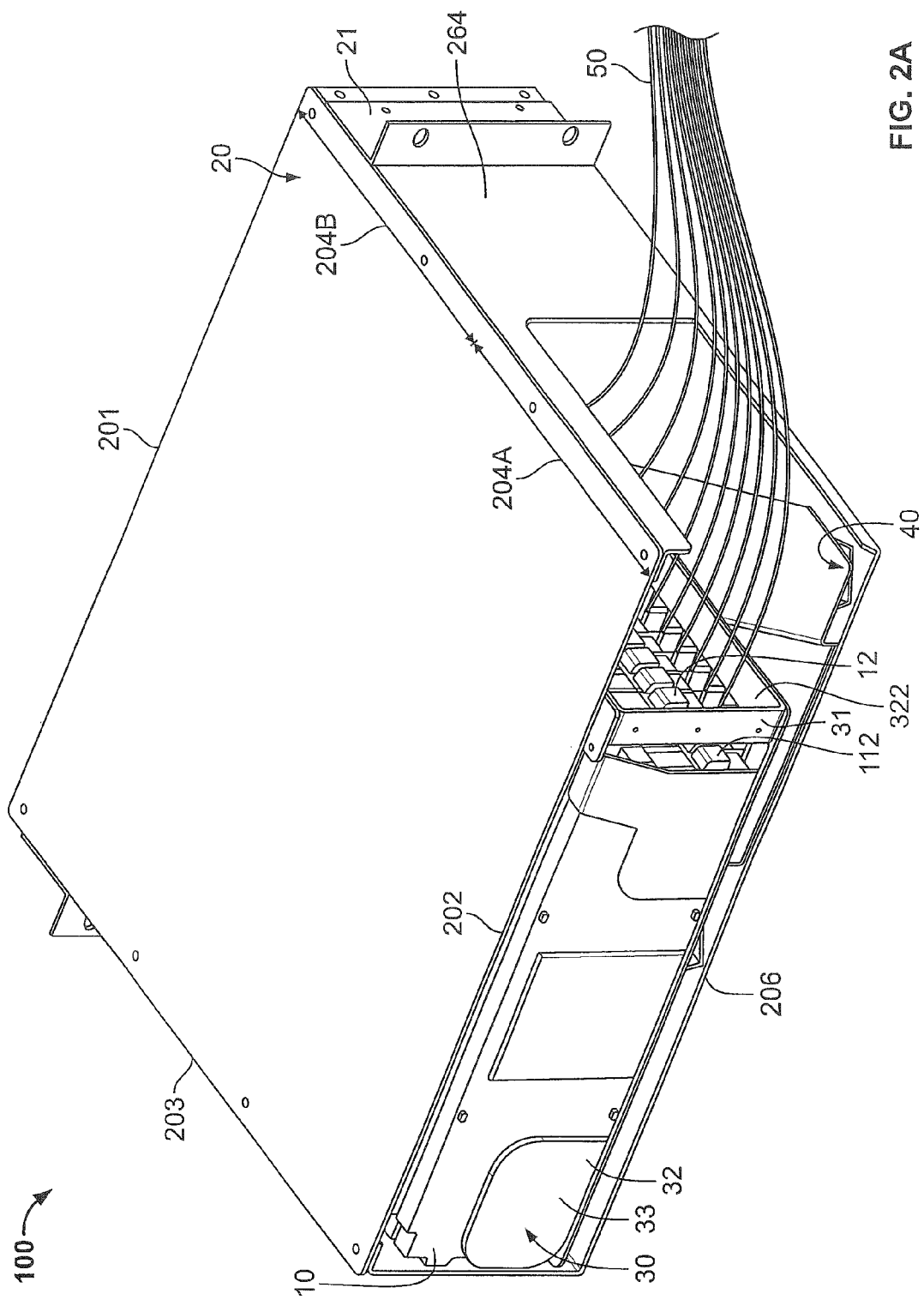
FIG. 2A is a perspective view of a cassette conveying system with a cassette holding assembly in a stored state.
Figure 2B:
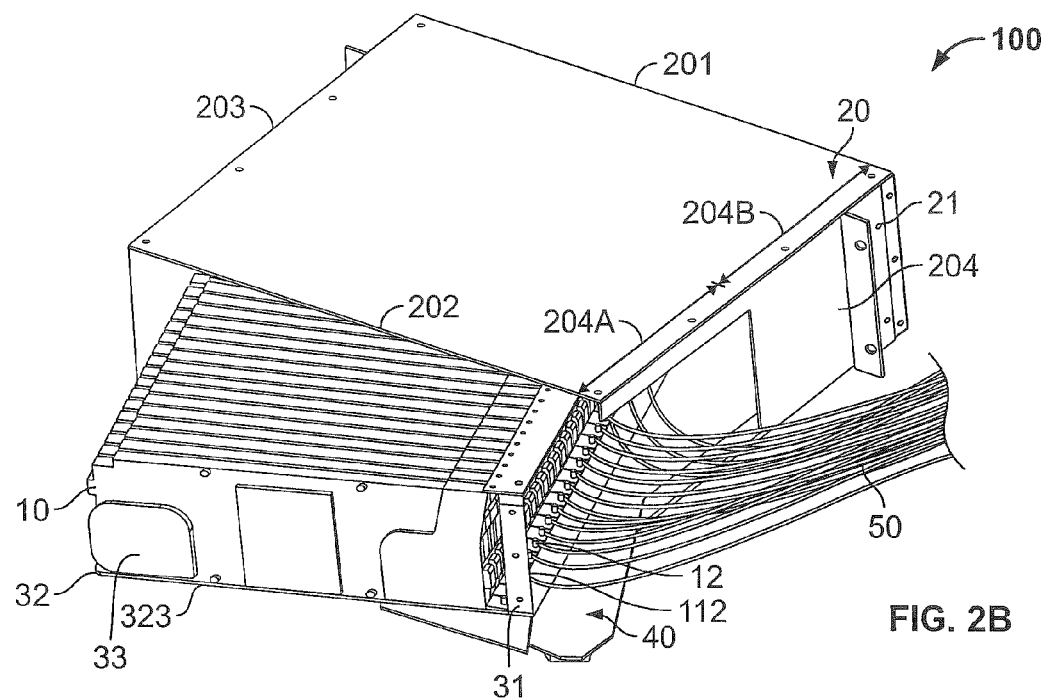
FIG. 2B is a perspective view of the cassette conveying system of FIG. 2A with the cassette holding assembly in a retracted state.
Figure 2C:
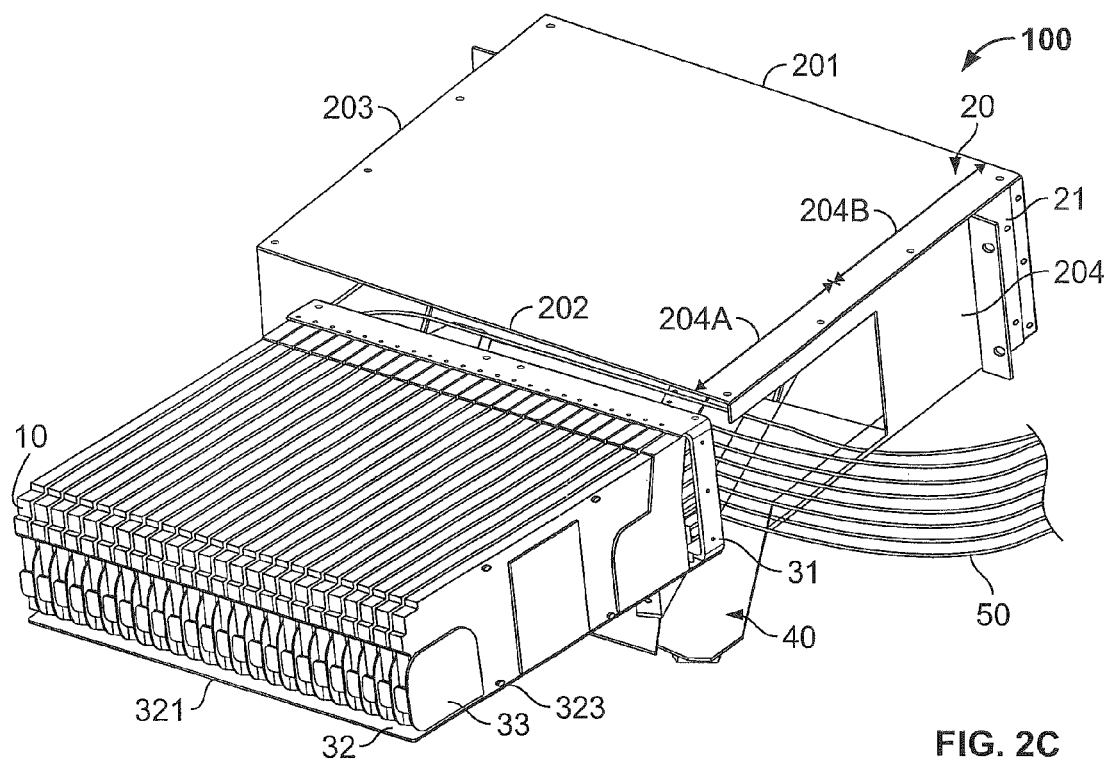
FIG. 2C is a perspective view of the cassette conveying system of FIG. 2A with the cassette holding assembly in a retracted state.
Figure 2D:
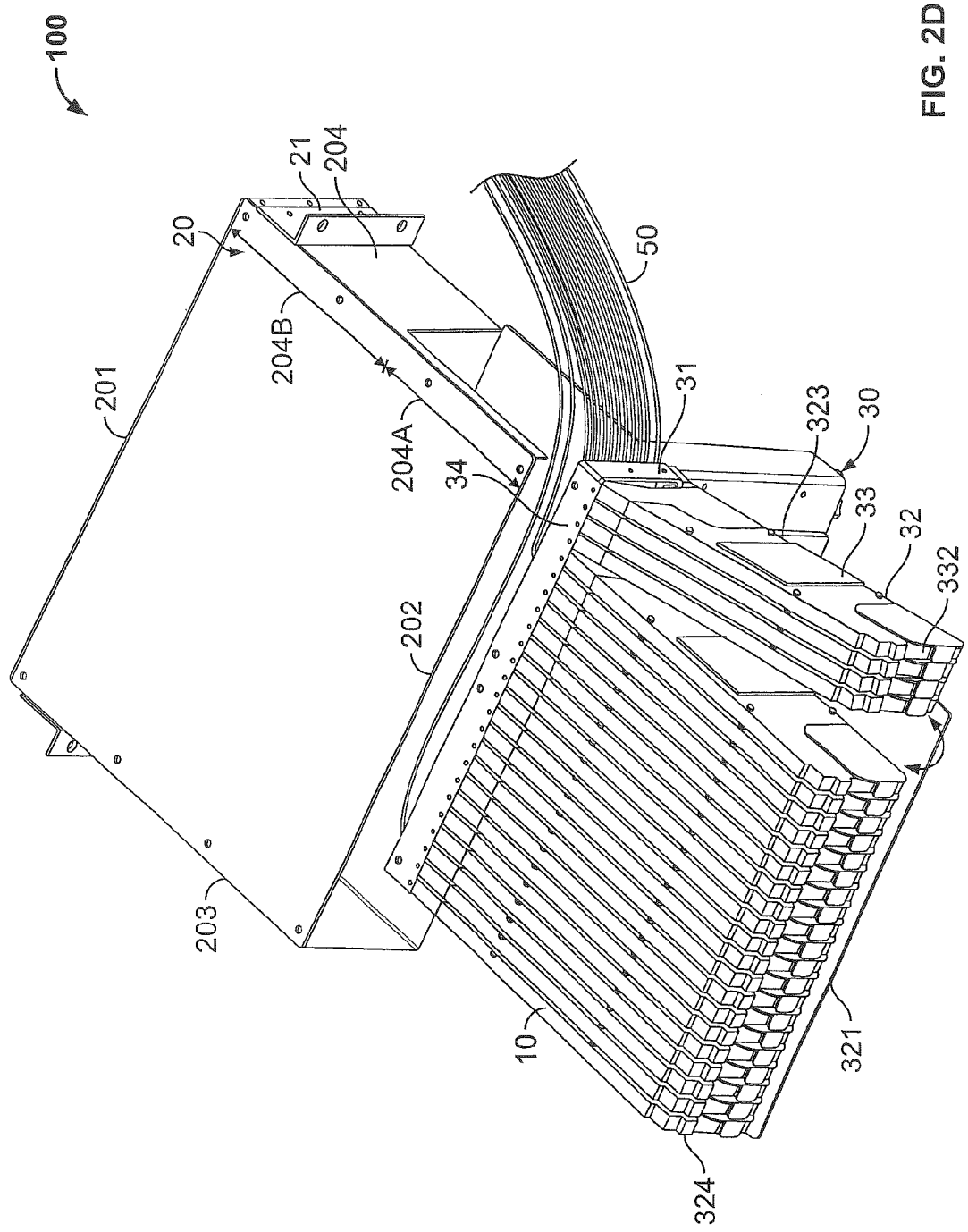
FIG. 2D is a perspective view of the cassette holding assembly of FIG. 2A with the cassette holding assembly in a retracted state with cassettes in a separated state.
Figure 2E:
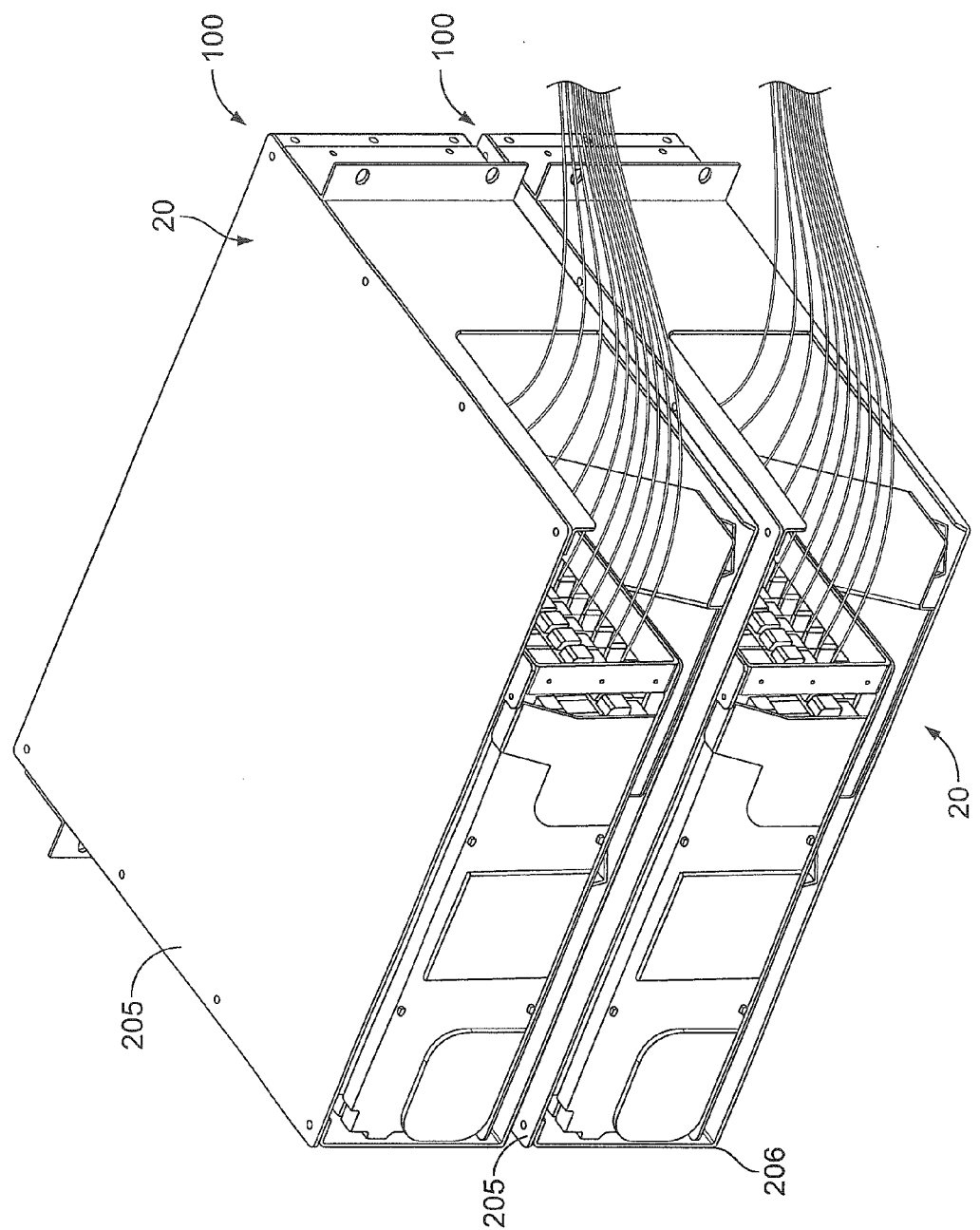
FIG. 2E is a perspective view of two cassette conveying systems of FIG. 2A in a vertical stack configuration.

Referring to FIGS. 2A-2E, the system 100 may include a housing 20 having a back and a front side 201, 202, a left and a right side 203, 204, and a top and a bottom portion 205, 206. In addition, the housing 20 may include a mounting bracket 21 on the left and/or right sides 203, 204 for purposes of attaching the housing 20 to a rack or frame (not shown) typically used in networking applications. The housing 20 may be open at front side 202 and may be at least partially open at the left and right sides 203, 204, or the housing 20 may include a door (not shown) operably disposed on the housing 20 to enclose the open portions of the front side 202 and the left or right sides 203, 204 of the housing 20. In the exemplary embodiment shown, right side 204 may have an open portion 204A and a closed portion 204B. As shown in FIG. 2E, multiple housings 20 may be stacked upon one another such that multiple systems 100 may be provided to form a vertical stack of cassette conveying systems 100 attached to a frame or rack. In such a configuration, to reduce materials and manufacturing costs, it is envisioned that the top portion 205 of one system 100 may serve as the bottom portion 206 for the system 100 directly above it.

Figure 3A:
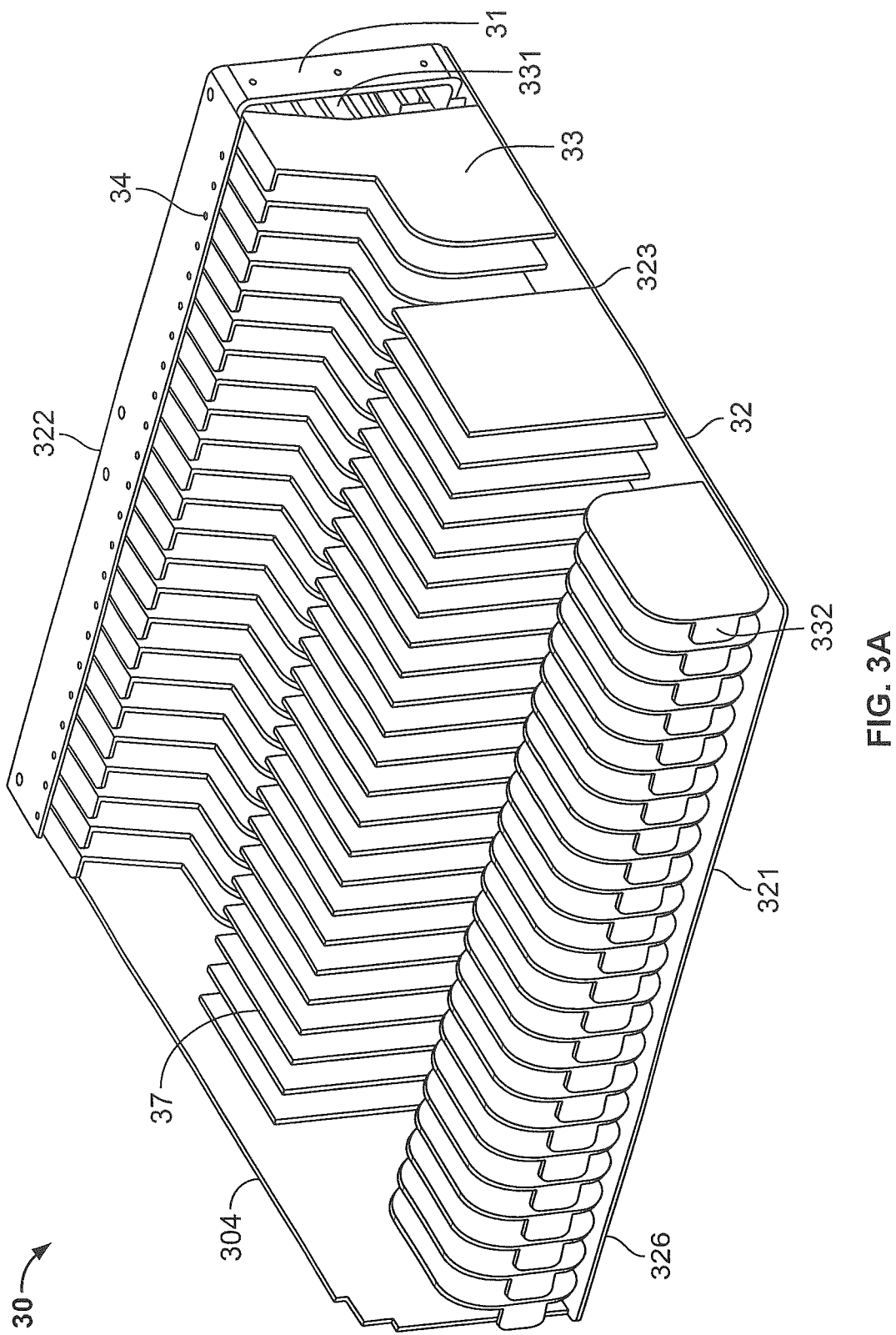
FIG. 3A is a perspective view of an embodiment of a cassette holding assembly.
Figure 3B:
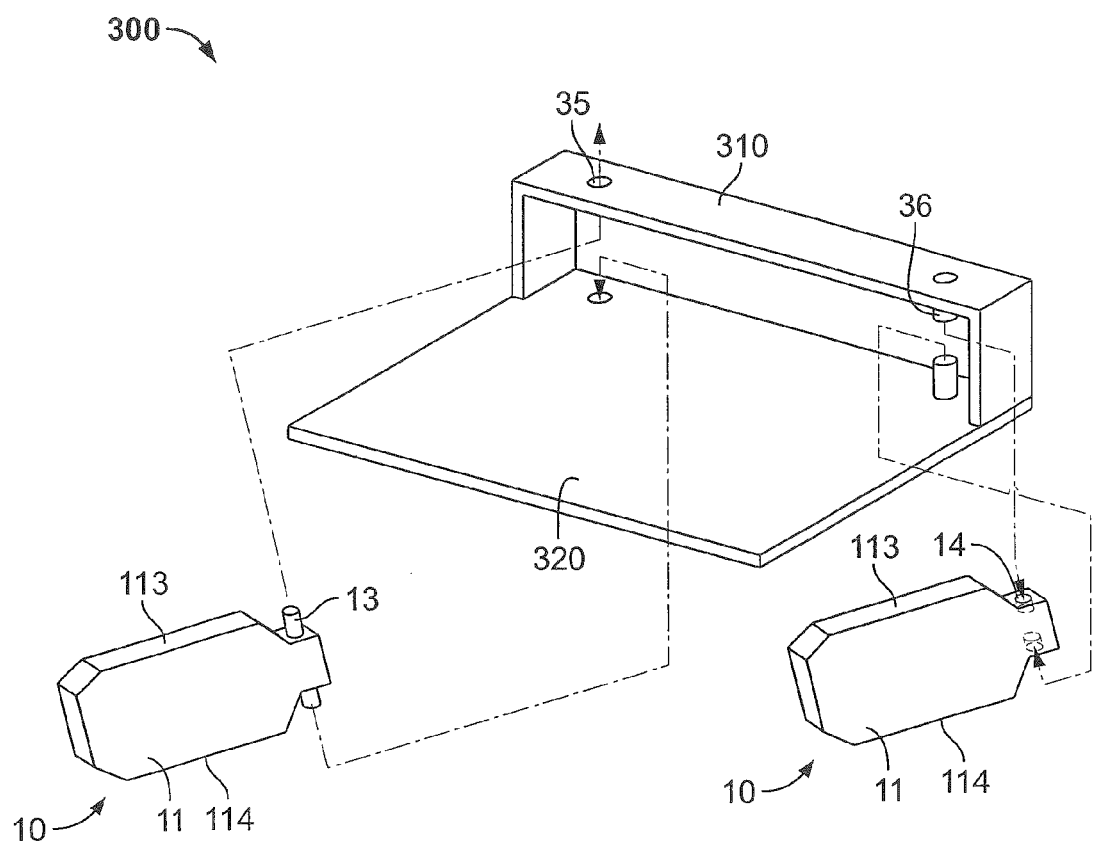
FIG. 3B is a perspective view of another embodiment of a cassette holding assembly.

Referring to FIGS. 3A and 3B, the cassette holding assembly 30 may include a bracket 31, a tray 32 extending from the bracket 31, and a plurality of support tracks 33 for supporting a plurality of cassettes 10. Tray 32 may include a bottom surface 326 and extend from a front side 322, along which the bracket 31 is disposed, to a back side 321, and further define a left side 323 and right side 324.

The support tracks 33 may be coupled to the bracket 31 at first ends 331 and extend to second ends 332 over the tray 32, each track 33 defining a slot 37 within which a cassette 10 may be inserted. A cassette 10 may be inserted into a slot 37 of a track 33 such that the front side 112 of the enclosure 11 is adjacent the first end 331, the back side 111 is adjacent the second end 332, and the cassette 10 rests against the track 33 on its left or right sides 113, 114. The support tracks 33 may be disposed along the bracket 31 such that cassettes 10 inserted therein are arranged with their respective front sides 112 held in horizontal alignment along the bracket 31. Furthermore, support tracks 33 may be pivotably coupled to the bracket 31 at a pivot point 34, such that a cassette 10 supported by the track 33 may pivot about the bracket 31.

In another embodiment of a cassette holding assembly 300, as shown in FIG. 3B, the cassettes 10 may be pivotably coupled directly to the assembly 300, without support from a support track 33. Holding assembly 300 may include a bracket 310 and a tray 320 extending therefrom. The cassette 10 may include pivot pins 13 disposed on the left and right sides 113, 114 of the enclosure 11 adapted to pivotably couple with pivot holes 35 disposed along the bracket 310, or the bracket 310 may include pivot pins 36 adapted to pivotably couple with pivot holes 14 disposed on the left and right sides 113, 114 of the enclosure 11. As such, the bracket 310 may be configured to arrange the front sides 112 of a plurality of cassettes 10 in horizontal alignment along the bracket 310, with the left or right sides 113, 114 of the cassettes 10 supported by and extending along the tray 320. The pivotal coupling of the cassettes 10 to the brackets 31, 310, such as in the embodiments of the cassette holding assemblies shown in FIGS. 3A and 3B, advantageously permits the cassettes 10 to be pivoted about the bracket 31, 310, so that individual cassettes 10 may be accessed by movement away from adjacent cassettes 10, such as shown in FIG. 2D.

An exemplary cassette conveying assembly 40 will now be described with reference to FIGS. 4A and 4B, which show an exemplary configuration of the cassette conveying assembly 40 within the system 100 coupled to the housing 20 and a tray 32 of a cassette holding assembly 30. Conveying assembly 40 may include a linear movement component and a rotational movement component which, when operatively coupled to the housing 20 and a cassette housing assembly 30, provide that the cassette holding assembly 30 may be moved linearly and rotationally, desirably simultaneously, in relation to the housing 20. In one embodiment, the assembly 40 may include a first track 41 extending linearly between first and second ends 411, 412, and a second track 42 extending parallel to the first track 41 between first and second ends 421, 422. First and second tracks 41, 42 may be fixedly coupled to the bottom surface 206 of the housing 20 such that the respective first ends 411, 421 extend toward the back side 201 of the housing 20 and the respective second ends 412, 422 extend toward the front side 202 of the housing 20. First and second rails 433, 437 are slidably coupled to the tracks 41, 42, respectively. First and second tracks 41, 42 may extend at an angle θ away from the back side 201 of the housing 20. As described in detail below, the angle θ may be selected such that a cassette holding assembly 30 coupled to the conveying assembly 40 may be rotated away from the back side 201 of the housing 20 and moved linearly toward the open portion 204A of the right side 204 of the housing 20 in the direction of the second ends 412, 422, to transition from a stored state to a retracted state.

The assembly 40 may further includes a pallet 43 having a bottom surface 436 fixedly coupled to the first and second rails 433, 437, and a top surface 435 adapted to be coupled through a rotational assembly 44, as described below, to the bottom surface 326 of the tray 32. The pallet 43 is coupled to the rails 433, 437 such that the pallet 43 may move linearly in correspondence with sliding movement of the rails 433, 437 between the first ends 411, 421 and second ends 412, 422 of the tracks 41, 42, toward and away from the back side 201 of the housing 20. When the first and second rails 433, 437 are moved to the first ends 411, 421, respectively, the pallet 43 attached thereto may be completely stored within the housing 20 (see FIG. 4A). When the first and second rails are moved away from the first ends 411, 421 towards the second ends 412, 422, respectively, the pallet 43 moves linearly towards the right side 204 and front side 202 of the housing and may become disposed at least partially external the housing 20.

The conveying assembly 40 may further include the rotational assembly 44 having a first plate 441 fixedly attached to the top surface 435 of the pallet 43, a second plate 442 for fixedly coupling to the bottom surface 326 of the tray 32 of the cassette holding assembly 30 and a rotational element 443 adapted to couple the plates 441 and 442 to each other such that the plate 442 is rotatably coupled to the plate 441. The assembly 44 is operable such that, when the plate 442 is fixedly coupled to the tray 32 of the assembly 30, the plate 442 is rotatable relative to the plate 441, thereby providing that the holding assembly 30, as well as the cassettes 10 supported by the assembly 30, may be rotated about the pallet 43. Furthermore, the assembly 44 may have a limited axis of rotation to avoid tensioning of the cables 50 extending from the cassettes 10 of the assembly 30 when the assembly 30 is transitioned from a stored state to a retracted state, as described in detail below.

Further referring to FIGS. 2A-2C, when the holding assembly 30 is coupled to the conveying assembly 40 by the rotational assembly 44, and the conveying assembly 40 is fixedly coupled to the housing 20 by the tracks 41, 42, the holding assembly 30 may be simultaneously linearly slidable and rotatable relative to the housing 20 based on operation of the conveying assembly 40, such that the holding assembly 30 may transition between a stored state (FIG. 2A) and a retracted state (FIGS. 2B and 2C) in relation to the housing 20.

In the stored state, holding assembly 30 may be stored entirely within the housing 20 and oriented such that the bracket 31 and front side 322 of the tray 32 face the right side 204 of the housing 20. Accordingly, the ports 12 of the cassettes 10 supported by the holding assembly 30 face the right side 204 as well. Cables 50 may extend from the ports 12, through the open portion 204A of the right side 204 of the housing 20, curve around the closed portion 204B of the right side 204 and then extend generally parallel to the right side 204 toward the back side 201 of the housing 20.

In accordance with the present disclosure, when the cassette holding assembly 30 is positioned by the conveying assembly 40 in a stored state as shown in FIG. 4A, a dimension in a longitudinal direction between the front side 322 of the tray 32 of the holding assembly 30 and the right side 204 of the housing 20 may be defined based only on the space needed to accommodate cables 50 that extend away from the cassettes held by the holding assembly 30 and routed within the housing 20 along the right side 204 and then external to the housing 20. Stated another away, the length of the longitudinal dimension of the housing 20 extending between the left and right sides 203, 204 is predetermined based on the size of the holding assembly 30 to be stored therein, and the length of such dimension need not be increased to permit transition of the holding assembly 30 from the stored state to a retracted state. As described below, the holding assembly 30 may be transitioned from a stored state to a retracted state by rotation relative to the housing 20 away from the back side 201 and toward the front and right sides 202, 204, by operation of the conveying assembly 40, in which the holding assembly 30 may also be simultaneously moved linearly away from the back side 201 of the house 20, without providing additional space in the housing 20 to permit the desired rotational movement of the holding assembly 30 relative to the housing 20 to transition between the retracted state and stored state.

In one embodiment, the holding assembly 30 may be transitioned from the stored state to a first retracted state (FIG. 2B), wherein the assembly 30, by operation of the rotational assembly 44 of the conveying assembly 40, may be rotated relative to the pallet 43 and, thus, the housing 20, without being obstructed by any portion of the housing 20, by linearly moving the assembly 30 away from the back side 201 of the housing 20 while rotating the assembly 30. As the pallet 43 is moved linearly in correspondence with sliding movement of the rails 433, 437 along the first and second tracks 41, 42 from respective first ends 411, 421 to respective second ends 412, 422, the holding assembly 30 coupled thereto may be simultaneously rotated in a counter-clockwise direction as shown in FIGS. 2A-2C and 4A-4B, to move away from the back side 201, such that a portion of the holding assembly 30 becomes disposed external to the housing 20 at the front side 202 and the open portion 204A of the right side 204 of the housing 20.

Figure 4B:
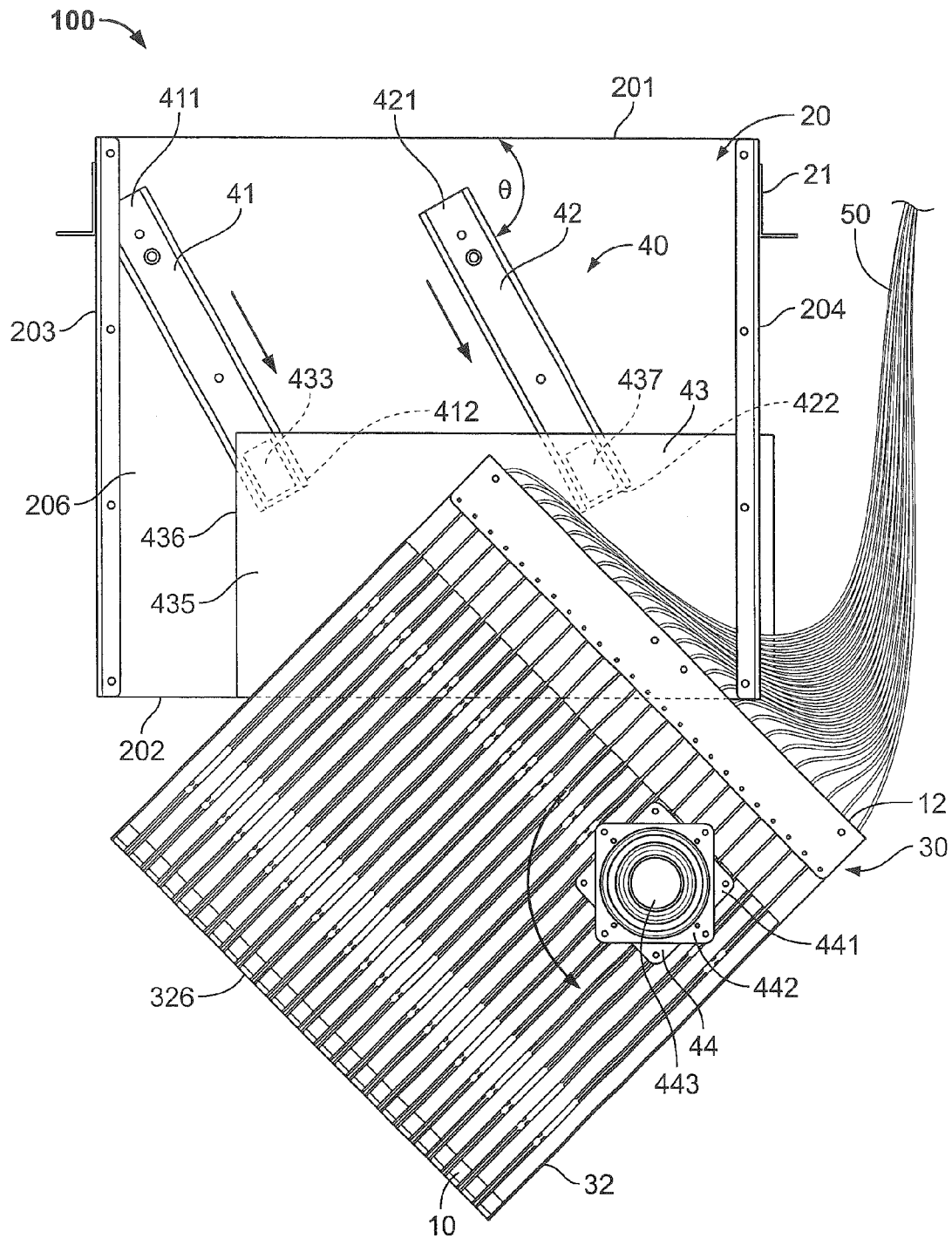
FIG. 4B is a top view of the cassette conveying assembly adapted to a cassette holding assembly in the housing of FIG. 4A with the cassette holding assembly in a retracted state.

The holding assembly 30, as shown in FIGS. 2B and 4B, may be further rotated about the pallet 43 and thus the housing 20, by operation of the rotational assembly 44, in a counter-clockwise direction, and also the holding assembly 30 may move linearly in correspondence with movement of the pallet 43, until the holding assembly 30 reaches a retracted state as shown in FIG. 2C. In the retracted state of FIG. 2C, the bracket 31 may face, and be substantially parallel, to the front side 202 of the housing 20.

As the holding assembly 30 transitions to the retracted states shown in FIGS. 2B and 2C, the cables 50 extending from the cassettes 10, previously curved around the closed portion 204B of the right side 204 in the stored state (FIG. 2A), may straighten as the cassettes 10 move to their respective locations in the retracted state. Thus, the operation of the conveying assembly 40 providing for a combination of linear movement of the holding assembly 30 in correspondence with movement of the pallet 43, and rotational movement of the holding assembly 30 by operation of the rotational assembly 40, which may be simultaneous, advantageously limits pulling or tensioning of the cables 50 during transition of the holding assembly 30 between the stored state and retracted state. Consequently, little to no additional length of cable 50 needs to be provided for coupling to the conveying system 100 to accommodate transition of the holding assembly 30 from the stored state to a retracted state. Further, the combined simultaneous linear and rotational movability of the holding assembly 30 provided by operation of the conveying assembly 40 permits that additional space in the housing 20 does not need to be provided to permit transition of the holding assembly 30 between a stored state and retracted state. It is to be understood that the extent to which the holding assembly 30 must move away from the back side 201 of the housing 20 to obtain a retracted stated in which the cassettes 10 or cables 50 extending therefrom are accessible may vary depending on the dimensions of the housing 20, the size of the assembly 30 in relation to the housing 20, and the length and orientation of the first and second tracks 41, 42.

In addition, the holding assembly 30 may be rotated about the rotational assembly 44 in a clockwise direction, and also moved linearly toward the back side 201 of the housing 20 by the pallet 43 moving in correspondence with sliding movement of the rails 433, 437 along the first and second tracks 41, 42 towards the first ends 411, 421, to transition from a retracted state to the stored state. It is to be understood that both the linear sliding of the assembly 30 toward or away from the back side 201 and the rotation of the assembly 30 about rotational assembly 44 may be performed simultaneously, such that the assembly 30 may rotate in the counterclockwise direction as it is being linearly moved away from the back side 201 of the housing 20, and rotate in the clockwise direction as it is being linearly moved toward the back side 201 of the housing 20.

In one embodiment, the rotational assembly 44 may include a stopping mechanism (not shown) to limit rotation beyond that which is necessary to achieve an ultimate desired retracted state. The stopping mechanism, hence, may avoid positioning of the cassette holding assembly 30 at a position that may cause pulling on the cables 50, such that subjecting of the cables 50 to stress or tension may be avoided.

Figure 5A:
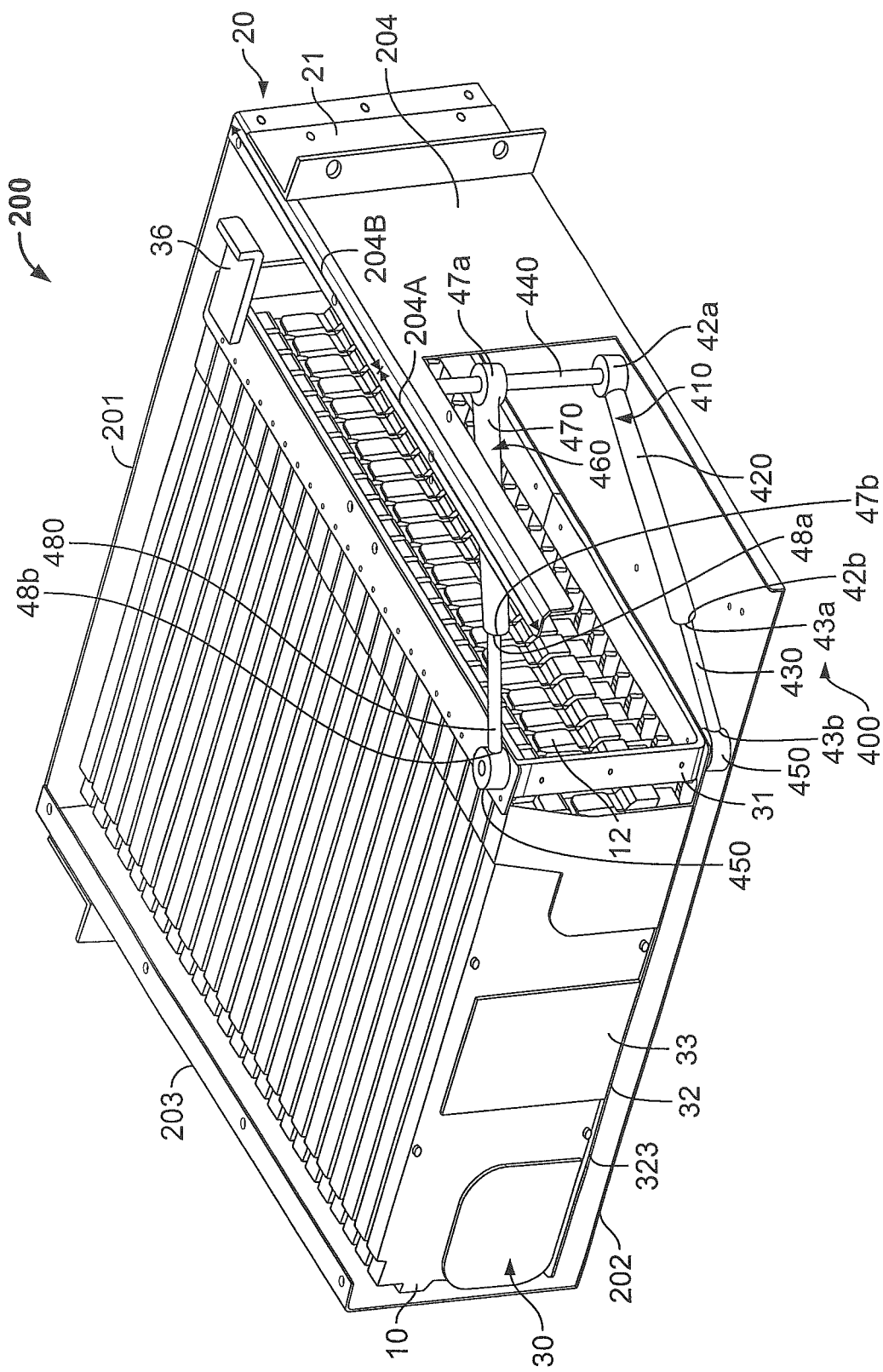
FIG. 5A is a perspective view of another embodiment of a cassette conveying system with a cassette holding assembly in a stored state.
Figure 5B:
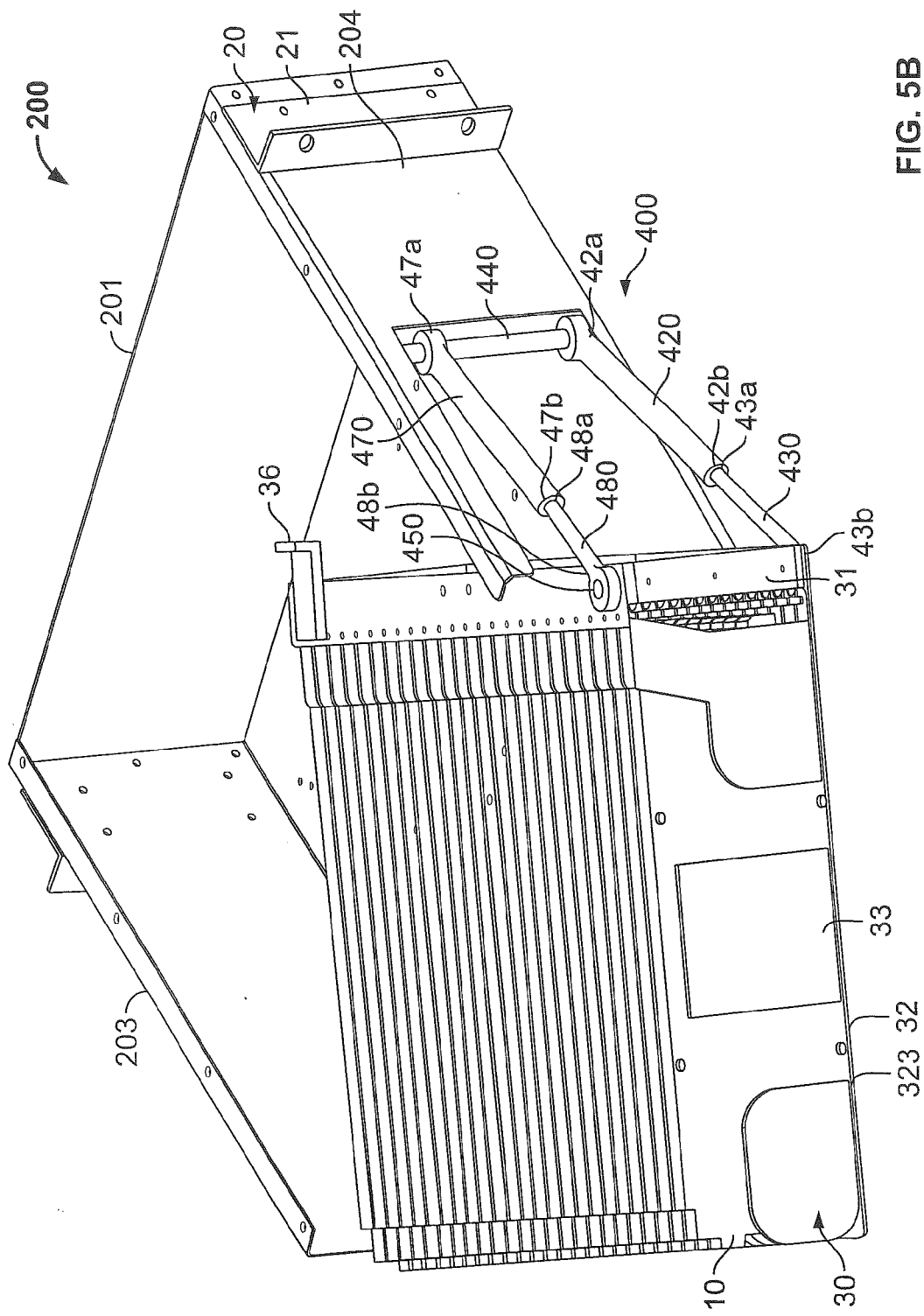
FIG. 5B is a perspective view of the cassette conveying system of FIG. 5A with a cassette holding assembly in a retracted state.
Figure 5C:
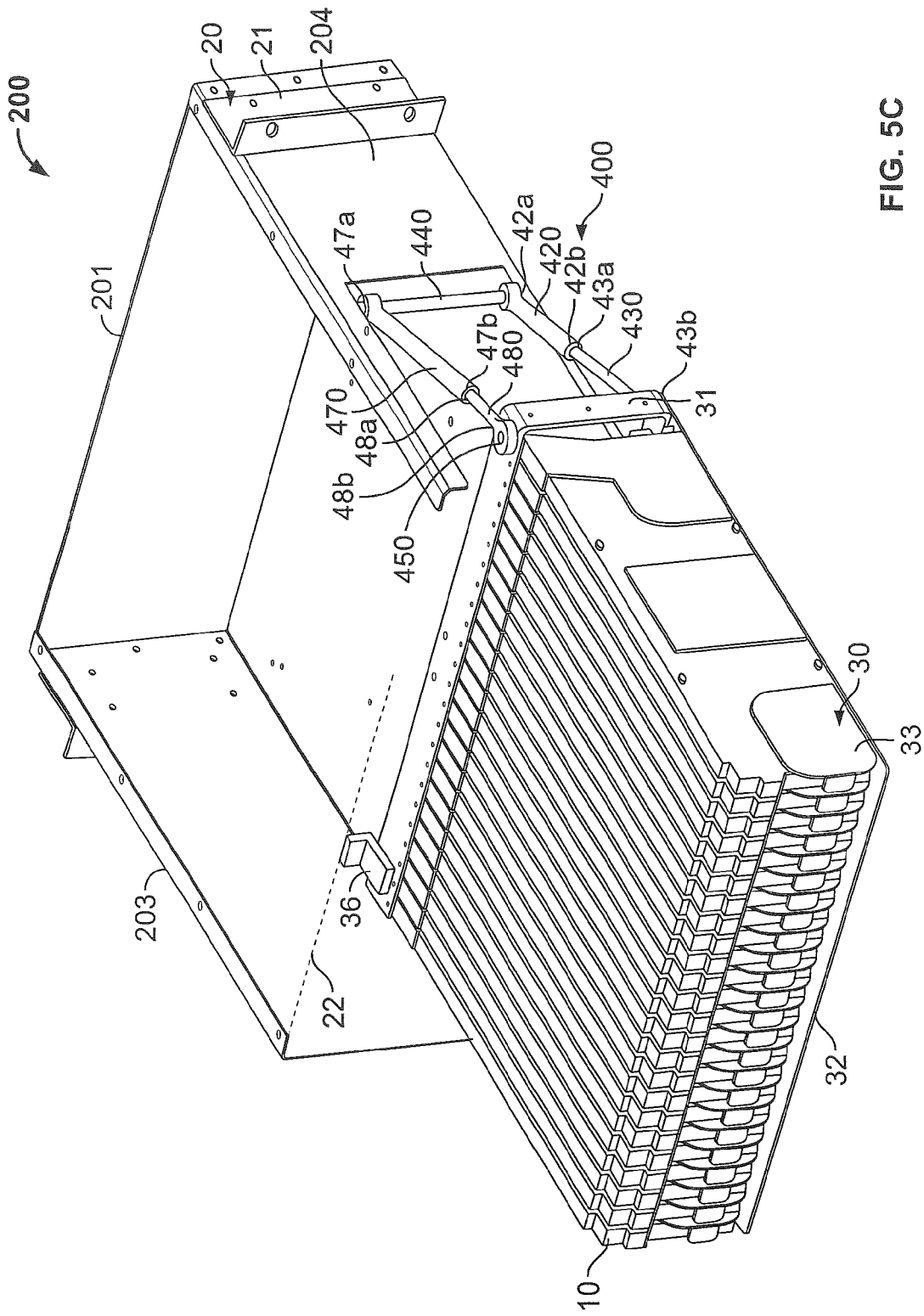
FIG. 5C is a perspective view of the cassette conveying system of FIG. 5A with a cassette holding assembly in a retracted state.

Referring to FIGS. 5A-5C an exemplary alternative cassette conveying system 200 may include a cassette conveying assembly 400 for coupling the cassette holding assembly 30 of system 100 with the housing 20 of system 100.

Cassette conveying assembly 400 may include an arm member 410 having a first member 420 defining a first and second end 42a, 42b, and a second member 430 defining a first and second end 43a, 43b. The first end 42a of the first member 420 may be pivotably coupled to the right side 204 of the housing 20 about a shaft 440 adapted to be coupled along the right side 204 of the housing 20. The second end 43b of the second member 430 may be pivotably coupled to the bracket 31 of the holding assembly 30 about a pin 450 adapted to be attached to the bracket 31. Furthermore, the second member 430 may be adapted to linearly slide in or out of a hollow cylinder defined by the first member 420 and longitudinally extending from the second end 42b toward the first end 42a of the first member 420. To reinforce coupling of the holding assembly 30 with the housing 20, the conveying assembly 400 may further include a second arm member 460, including a third member 470 pivotably coupled to the shaft 440 at a first end 47a, a fourth member 480 pivotably coupled to another pin 450 attached to the bracket 31 at a second end 48b, the fourth member 480 adapted to linearly slide in or out of a hollow cylinder defined by the third member 470 and longitudinally from a second end 47b to the first end 47a of the third member 470.

In an exemplary operation of the conveying assembly 400, when the holding assembly 30 is coupled to the housing 20 by the conveying assembly 400, the conveying assembly 400 is operable such that the holding assembly 30 may be simultaneously linearly slidable and rotatable relative to the housing 20 so as to transition between a stored state (FIG. 5A) and retracted states (FIGS. 5B and 5C).

In the stored state, holding assembly 30 is stored entirely within the housing 20 and oriented such that the bracket 31 and front side 322 of the tray 32 face the right side 204 of the housing 20. Similar to the conveying assembly 40, the conveying assembly 400 is operable such that the holding assembly 30 may be transitioned from the stored state toward a retracted state (such as shown in FIGS. 5B and 5C), by rotating the assembly 30 in a counterclockwise direction, which is obtained by rotating of the first and third members 420, 470 about the shaft 440 and also rotating, desirably simultaneously, the second and fourth members 430, 480 relative to the housing 20 at the second ends 43b, 48b, and furthermore by moving the assembly 30 linearly, generally parallel to the sides 203, 204 of the housing 20 away from the back side 201 of the housing 20, which is obtained by the second and fourth members 430, 480 telescoping away from the first and third members 420, 470 by linearly sliding therein.

In addition, the conveying assembly 400 is operable such that the holding assembly 30 may be transitioned from a retracted state to the stored state (such as shown in FIG. 5A), by rotating the assembly 30 in a clockwise direction, which is obtained by rotating of the first and third members 420, 470 about the shaft 440 and also rotating, desirably simultaneously, the second and fourth members 430, 480 relative to the housing at second ends 43b, 48b, and furthermore by moving the assembly 30 linearly, generally parallel to the sides 203, 204 of the housing 20 toward the back side 201 of the housing 20, which is obtained by the second and fourth members 430, 480 moving into the first and third members 420, 470 by linearly sliding therein.

The holding assembly 30, thus, may be transitioned, based on operation of the conveying assembly 400 to provide for rotational and linear movement of the holding assembly 30, desirably simultaneously, such that the movement of the holding assembly 30 to transition between the stored state and retracted state is not obstructed by any portion of the housing 20. Referring to FIG. 5C, in one retracted state, the assembly 30 has been rotated to provide that the bracket 31 faces and is substantially parallel to the front side 202 of the housing 20. Thus, as in the retracted state provided by conveying assembly 40 (see FIG. 2C), the operation of assembly 400 limits pulling or tensioning of the cables 50 extending from cassettes 10 supported by the holding assembly 30 during transition of the assembly 30 between the stored state and retracted state. Consequently, little to no additional length of cable 50 needs to be provided for coupling to the conveying system 200 to accommodate transition of the holding assembly 30 from the stored state to a retracted state. Furthermore, the operability of the conveying assembly 400 permits that additional space in the housing 20 does not need to be provided to permit transition of the holding assembly 30 between a stored state and retracted state.

In one embodiment, a flanged portion 36 may be disposed along the bracket 31 of the holding assembly 30 to contact a bar 22 disposed extending along the front side 202 of the housing 20 in order to control the extent of transition of the holding assembly 30 away from the back side 201 of the housing 20 when transitioning into the retracted state. Although not shown, the flanged portion 36 and bar 22 may also be incorporated into conveying system 100.

Although the invention herein has been described with reference to particular embodiments, it is to be understood that these embodiments are merely illustrative of the principles and applications of the present invention. It is to be understood unless otherwise indicated herein that the figures are not intended to be to scale. It is therefore to be understood that numerous modifications may be made to the illustrative embodiments and that other arrangements may be devised without departing from the spirit and scope of the present invention as defined by the appended claims.

The invention claimed is:

1. A conveying assembly for conveying a cassette holding assembly for holding one or more cassettes, each cassette configured for holding at least one device and receiving one or more cables for operatively connecting to the device, the conveying assembly comprising:
a first track extending linearly from a first end to a second end;
a first rail slidably coupled to the first track and transitionable between the first end and the second end;
a pallet coupled to the first rail such that the pallet is linearly movable in a direction of the first track in correspondence with the first rail transitioning between the first end and the second end of the first track; and
a rotational assembly coupled to the pallet and configured for coupling to a cassette holding assembly such that, by operation of the rotational assembly, the cassette holding assembly is rotatable relative to the pallet,
wherein, when the rotational assembly is coupled to the cassette holding assembly in an installed state,
the cassette holding assembly is linearly movable in correspondence with the linear movement sliding of the pallet based on the first rail sliding along the first track to transition between the first end and the second end, and
the cassette holding assembly is rotatable relative to the pallet.

2. The conveying assembly of claim 1, wherein, in the installed state, the cassette holding assembly is simultaneously linearly movable and rotatable.

3. The conveying assembly of claim 1, further comprising:
a second track extending linearly from a first end to a second end and extending parallel to the first track, and
a second rail slidably coupled to the second track and transitionable between the first end and the second end of the second track,
wherein the pallet is coupled to the first and second rails such that the pallet is linearly movable in a direction of the first and second tracks in correspondence with the first and second rails transitioning between the first ends and the second ends of the first and second tracks, respectively, and
wherein, when the rotational assembly is coupled to the cassette holding assembly in an installed state, the cassette holding assembly is linearly movable in correspondence with the linear movement sliding of the pallet based on the first and second rails sliding along the first and second tracks to transition, respectively, between the first ends and the second ends.

4. The conveying assembly of claim 1, wherein the rotational assembly is limited to less than a 360-degree axis of rotation.

5. A cassette conveying system comprising:
a housing having front, back, left, and right sides, wherein the front side is open; and
a cassette holding assembly for holding one or more cassettes, the holding assembly including a bracket to which each cassette is coupled,
each cassette including at least one device and receiving one or more cables operatively connected to the device, and
a cassette conveying assembly operably coupling the cassette holding assembly to the housing such that the cassette holding assembly is linearly and rotationally movable in relation to the housing and transitionable between a stored state and a retracted state;
wherein, in the stored state, the cassette holding mechanism is stored completely within the housing; and
wherein, in the retracted state, the cassette holding mechanism is at least partially external the front side of the housing;
wherein the cassette holding assembly includes a flanged portion disposed on the bracket; and
the housing includes a bar extending at least partially across the front side of the housing,
wherein the flanged portion and the bar are adapted to contact each other to control an extent of movement of the cassette holding assembly away from the back side of the housing when the cassette holding assembly is moved by operation of the cassette conveying assembly.

6. The conveying system of claim 5, wherein the cassette holding assembly is simultaneously linearly and rotationally movable.

7. The conveying system of claim 5, wherein the cassette holding mechanism can be moved linearly away from the back side of the housing a sufficient distance to allow the cassette holding mechanism to be moved rotationally without obstruction from the left, right, or back sides of the housing.

8. The conveying system of claim 5, the cassette holding assembly further comprising one or more pivot points along the bracket for pivotably holding the one or more cassettes.

9. The conveying system of claim 5, wherein the cassette holding assembly is configured to hold a plurality of cassettes in alignment to form a stack.

10. The conveying system of claim 5, wherein the cassette holding assembly includes one or more support tracks extending from the bracket for holding the one or more cassettes.

11. The conveying system of claim 5, wherein the cassette conveying assembly includes:
a first track extending linearly from a first end to a second end;
a first rail slidably coupled to the first track and transitionable between the first end and the second end;
a pallet coupled to the first rail such that the pallet is linearly movable in a direction of the first track in correspondence with the first rail transitioning between the first end and the second end of the first track; and
a rotational assembly coupling the cassette holding assembly to the pallet,
wherein the cassette holding assembly is linearly movable in correspondence with the linear movement sliding of the pallet based on the first rail sliding along the first track to transition between the first end and the second end, and the cassette holding assembly is rotatable relative to the pallet.

12. The conveying system of claim 11, the cassette holding assembly further comprising a tray extending from the bracket, wherein the rotational assembly is coupled to the tray adjacent the front side and one of the left or right sides of the tray.

13. The conveying system of claim 5, wherein the cassette conveying assembly includes:

an arm member including a first member pivotably coupled to one of the right or left sides of the housing at a first end and defining a hollow cylinder at a second end; and a second member slidably inserted into the hollow cylinder of the first member at a first end and pivotably coupled to the cassette holding assembly at a second end, wherein the cassette holding assembly is simultaneously movable:

linearly by sliding of the second member in or out of the first member, and rotationally by pivotal movement of at least one of the first member about the right or left side of the housing or the second member about the cassette holding assembly.

14. The conveying system of claim 13, the cassette conveying assembly further comprising:

a second arm member including a third member pivotably coupled to one of the right or left sides of the housing at a first end and defining a hollow cylinder at a second end; and a fourth member slidably inserted into the hollow cylinder of the third member at a first end and pivotably coupled to the cassette holding assembly at a second end.

* * * * *